United States Patent [19]
Kajiwara

[11] Patent Number: 5,784,774
[45] Date of Patent: Jul. 28, 1998

[54] IC SOCKET JIG

[75] Inventor: Yasushi Kajiwara, Kawaguchi, Japan

[73] Assignee: Enplas Corporation, Saitama, Japan

[21] Appl. No.: 625,948

[22] Filed: Apr. 1, 1996

[51] Int. Cl.$^6$ .................................................. H05K 13/04
[52] U.S. Cl. ................................. 29/758; 29/741; 29/764
[58] Field of Search ......................... 29/741, 758, 64, 29/253

[56] References Cited

U.S. PATENT DOCUMENTS

| | | | |
|---|---|---|---|
| 4,392,301 | 7/1983 | Harres et al. | 29/76 X |
| 4,425,704 | 1/1984 | Cline | 29/76 X |
| 4,507,861 | 4/1985 | Sprenkle | 29/764 X |
| 4,679,319 | 7/1987 | Grabbe et al. | 29/764 X |
| 5,230,143 | 7/1993 | Karlovich | 29/758 X |
| 5,350,306 | 9/1994 | Del Prete et al. | 29/764 X |
| 5,502,887 | 4/1996 | Gonzales | 29/758 X |

*Primary Examiner*—Peter Vo
*Attorney, Agent, or Firm*—Fish & Richardson P.C.

[57] ABSTRACT

An IC socket jig is used in an IC socket pressing and affixing or releasing an electronic component with respect to contact pins by the movement of a slider in substantially a horizontal direction. The slider is moved in substantially a horizontal direction by an inclined portion formed in a cam pin of the jig which can vertically move. When the jig is attached to the IC socket, after a positioning pin is inserted into a positioning hole, the inclined portion of the cam pin is engaged with a shaft pin of the slider. When the jig is detached from the IC socket, after the engagement between the inclined portion of the cam pin provided in the upper block and the shaft pin of the slider of the IC socket is released, the positioning pin of the lower block is pulled out of the positioning hole of the socket body.

4 Claims, 5 Drawing Sheets

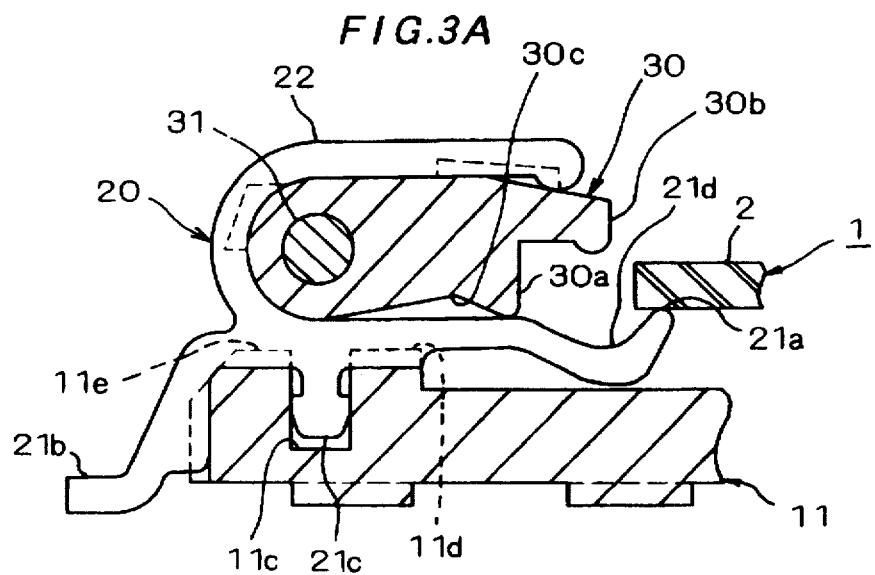
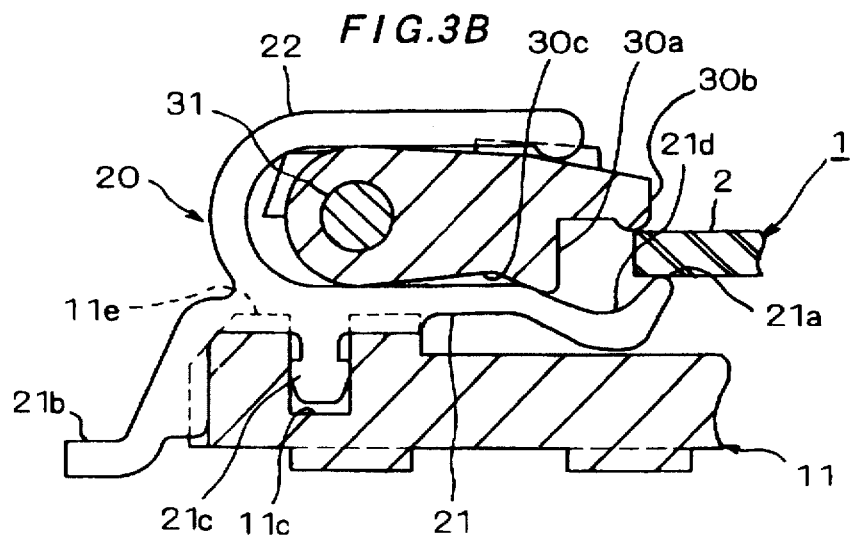
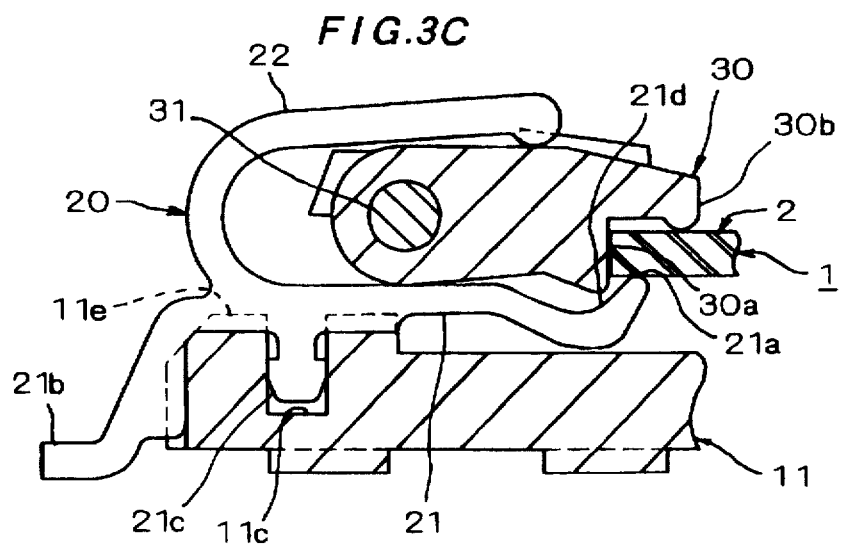

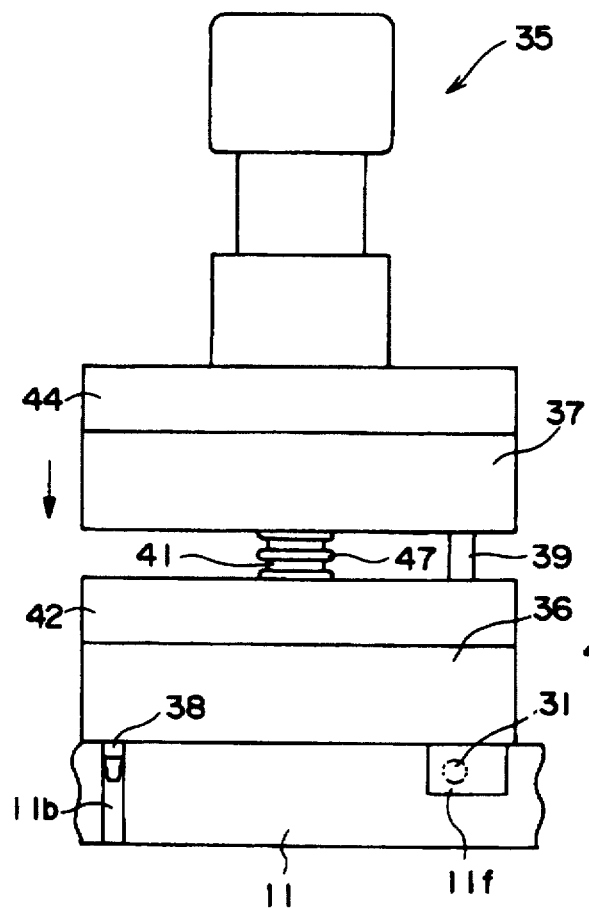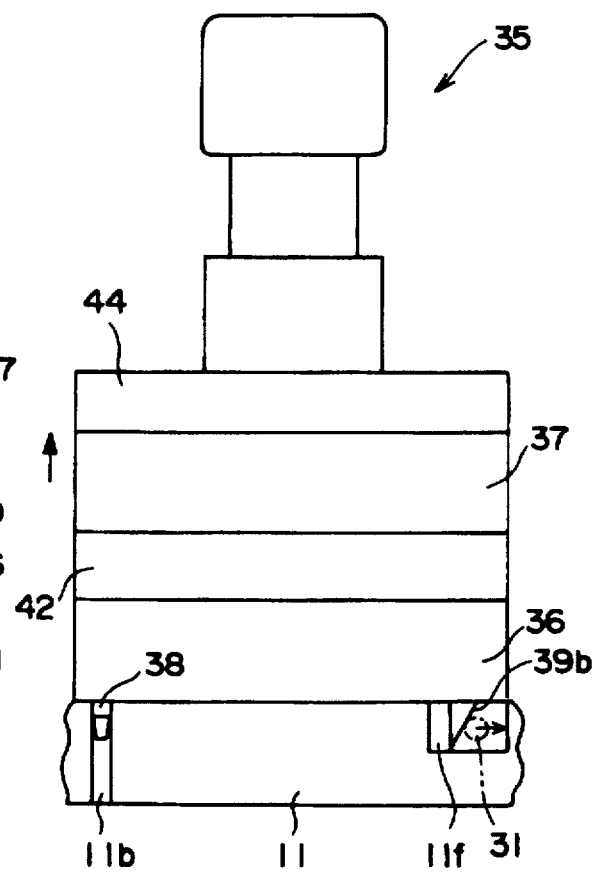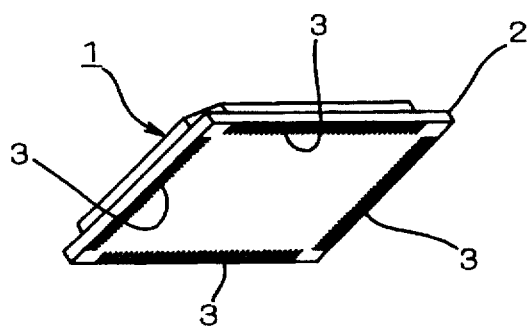

IC SOCKET JIG

BACKGROUND OF THE INVENTION

1. Field of the Invention

The present invention relates to an integrated circuit (IC) socket jig used in an IC socket which presses and affixes contact pins against an electronic component or releases the component by the movement of sliders in a substantially horizontal direction.

2. Description of the Related Art

Japanese Unexamined Utility Model Publication (Kokai) No. 7-29783 (Japanese Utility Model Application No. 5-58105) relating to an application filed by the present assignee discloses an IC socket for pressing and affixing an electronic component such as an IC chip or package against the contact pins or releasing the same by moving sliders in a substantially horizontal direction. An electronic component having a substantially rectangular shape has a large number terminals in the form of pads or leads arranged in parallel along its four sides or two facing sides thereof. The IC socket is provided with a large number of contact pins which are arranged in parallel along the four sides or two facing sides of the substantially rectangular shaped socket body. Each contact pin is provided with a base piece which has a contact portion coming into contact with the terminal of the electronic component at one end and has a lead portion electrically connected to a printed circuit board of an external portion at the other end and with an arm piece which is extended upward from this base piece while being curved. When the electronic component is placed on the connection portions of the contact pins which are parallel in state, the terminals thereof come into contact with the contact portions of the contact pins. Further, sliders are held between the base pieces and arm pieces of the contact pins in the parallel state. Each slider can move substantially horizontally between the pressing and affixing position at which the upper surface of the electronic component is pressed above the contact portions of the contact pins in the parallel state and the electronic component is affixed with respect to the contact pins and a releasing position for releasing the upper portions of the contact portions of the contact pins and releasing the electronic component from the contact pins. Accordingly, when these sliders are at the releasing position, it is possible to mount the electronic component on the contact portions of the contact pins from the top of the IC socket or take out the same from the top of the contact portions of the contact pins. Also, when the sliders are moved from the releasing position to the pressing and affixing position, the sliders individually press against the upper surface of the electronic component placed on the contact portions of the contact pins, therefore the terminals of the electronic component and the contact portions of the contact pins can be brought into contact with each other with a required contact pressure.

Further, Japanese Unexamined Utility Model Publication (Kokai) No. 7-29783 discloses an IC mounting jig for acting upon the sliders of an IC socket and substantially horizontally moving the sliders from the releasing position to the pressing and affixing position and an IC releasing jig for substantially horizontally shifting the sliders from the pressing and affixing movement to the releasing movement. These IC mounting jig and the IC releasing jig are provided with a plurality of leg pieces projecting downward from the jig body. An inclined surface is formed on an inner surface of each leg piece in the IC mounting jig and formed on an outer surface of each leg piece in the IC releasing jig, respectively. Accordingly, when the inclined surface of each leg piece of the IC mounting jig or the IC releasing jig is made to abut against a slider and the jig body is pressed, the slider is substantially horizontally pressed by the inclined surfaces of the leg pieces and moves from the pressing and affixing position to the releasing position or from the releasing position to the pressing and affixing position.

The above conventional IC mounting jig and IC releasing jig have a configuration for pressing the sliders in the horizontal direction corresponding to the amount of downward pressing of the slope portions of the leg pieces abutting against the sliders and moving the sliders horizontally. Therefore when the inclined portions of the leg pieces press the sliders in the horizontal direction, the inclined portions of the leg pieces receive a counterforce in the horizontal direction from the sliders.

Also, the IC mounting jig and the IC releasing jig are provided with pins for positioning with respect to the IC socket. They are inserted into the positioning holes formed in the IC socket when used, but when the inclined portions of the leg pieces of the jig receive a counterforce in the horizontal direction from the sliders when the operation to the sliders is completed and the jig is pulled out, the posture of the jig is limited, and therefore a so-called snap phenomenon is apt to occur between the positioning pins and the positioning holes having little clearance due to a slight inclination of the jig. Accordingly, when the jig is pulled out, the IC socket is forcibly pulled upward by the jig snapped to the IC socket, which becomes a cause of occurrence of deformation, damage, etc. of the IC socket and peeling in the conductor pattern on the circuit substrate connected to the contact pins of the IC socket.

SUMMARY OF THE INVENTION

Accordingly, an object of the present invention is to provide an IC socket jig which can prevent the deformation and damage of the IC socket, peeling of the conductor pattern of the circuit substrate connected and affixed to the contact pins of the IC socket, etc. when substantially horizontally moving the sliders for pressing and affixing or releasing the electronic component.

According to the present invention, there is provided an IC socket jig which is used in an IC socket for pressing and affixing or releasing an electronic component with respect to contact pins by moving sliders in a substantially horizontal direction. This IC socket jig has a positioning pin which can enter into or leave a positioning hole formed in a corner portion of the IC socket and a cam pin having an inclined portion at the front end. The cam pin can vertically move in parallel to the positioning pin with respect to the positioning pin so that the inclined portion is engaged with the slider after the positioning pin is inserted into the positioning hole of the IC socket. The positioning pin is drawn out of the positioning hole after the engagement between the inclined portion and the slider is released.

In an IC socket jig having the above configuration, when the jig is attached to an IC socket, the positioning pin of the jig is inserted into the positioning hole of the IC socket, the inclined portion of the cam pin provided in the jig can engage with the slider, therefore stoppage by engagement is carried out after the positioning of the jig with respect to the IC socket is reliably carried out and the inclined portion is smoothly inserted. In addition, the pressing of the slider by the inclined portion is carried out after the horizontal drawing is properly carried out, therefore the slider reliably operates in the horizontal direction, and an unnatural force is no longer applied to the IC socket. Also, when the jig is detached from the IC socket, after the engagement between the inclined portion of the cam pin and the slider is released, the positioning pin is drawn out of the positioning hole, therefore in a state where there is no counterforce in the horizontal direction with respect to the pressing force to the slider acting upon the inclined portion of the cam pin, that is, in a state where there is no unnatural force acting in the horizontal direction upon the jig via the cam pin, the positioning pin can be easily pulled out from the positioning hole. Accordingly, it is possible to prevent the IC socket from being pulled upward by the jig at the pull-up of the jig.

Preferably, the positioning pin is provided in a lower block body, the cam pin is provided in an upper block arranged a distance from the lower block, and the lower block body and the upper block are arranged so that they can be displaced relative to each other.

According to the above configuration, by providing the positioning pin in the lower block body and providing the inclined portion in the upper block arranged a distance from the lower block, it is possible to easily perform the operation with a time difference as mentioned above in the two blocks.

Also, preferably, the lower block body and the upper block are disposed via the guide shaft so that they can be displaced relative to each other.

According to the above configuration, the operation of the lower block body and the upper block become reliably and smoothly carried out by the guide of the guide shaft.

Further preferably, a spring biasing the two blocks in separate directions is interposed between the lower block body and the upper block.

According to the above configuration, by interposing between the lower block body and the upper block the spring biasing the two blocks in separate directions, the return is automatically stably carried out.

BRIEF DESCRIPTION OF THE DRAWINGS

FIGS. 3A, 3B, and 3C are vertically sectional views of the principal parts for explaining the method of using the socket body of FIG. 1.

FIGS. 7A and 7B are explanatory views of the operation of the IC socket jig for releasing the IC, respectively.

FIG. 8 is a perspective view showing one example of the IC chip.

Figure 1:
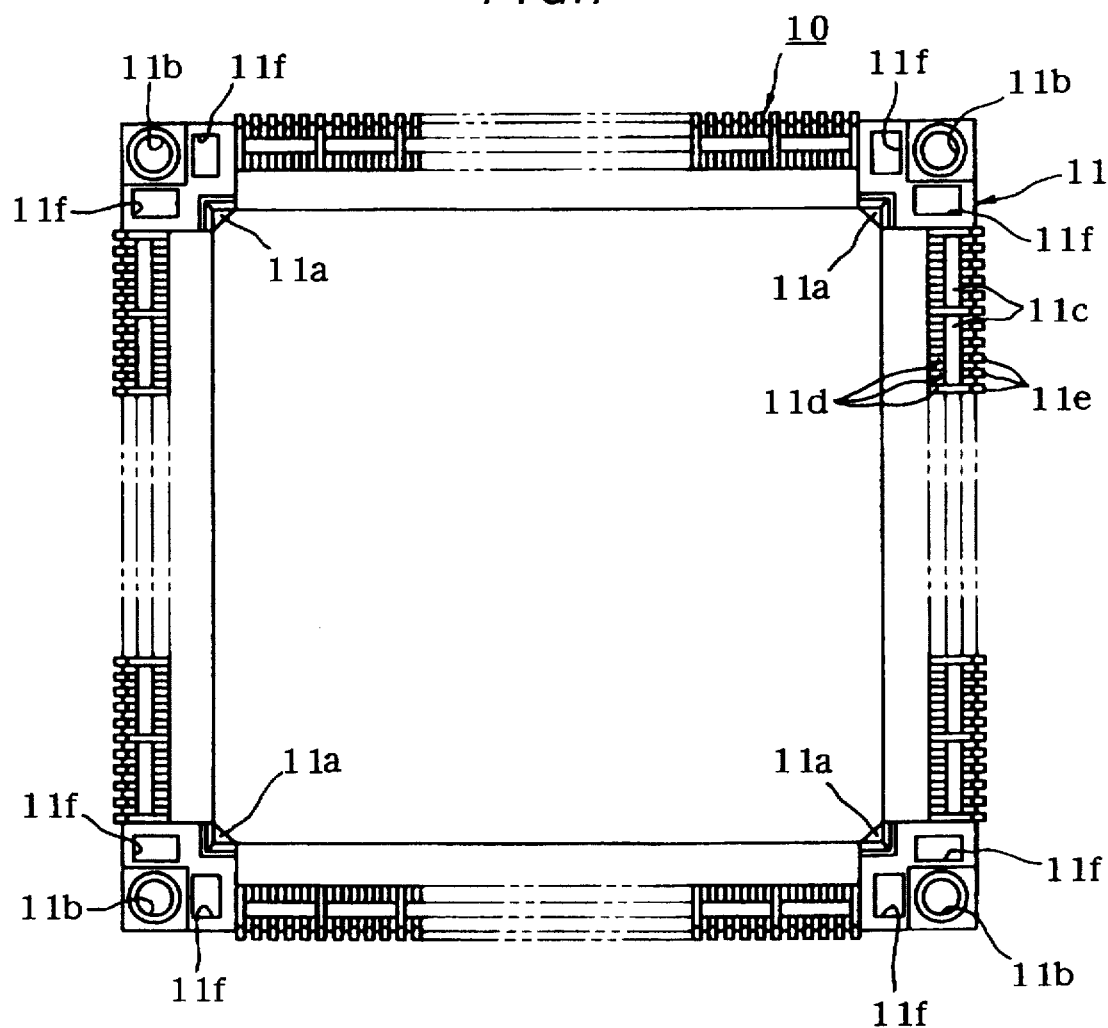
FIG. 1 is a schematic plan view of a socket body of an IC socket applied to an embodiment of the present invention.
Figure 2A:
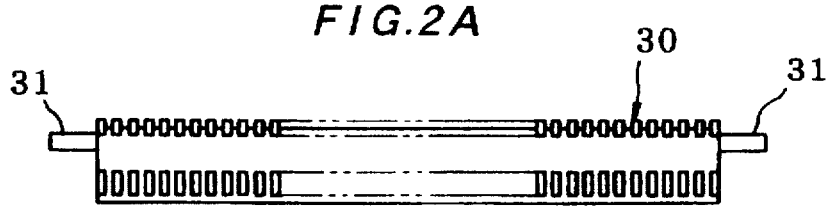
FIGS. 2A, 2B, 2C, and 2D are a plan view, a front view, a right side view, and a bottom view substantially showing the slider used in the socket body of FIG. 1, respectively.
Figure 2B:
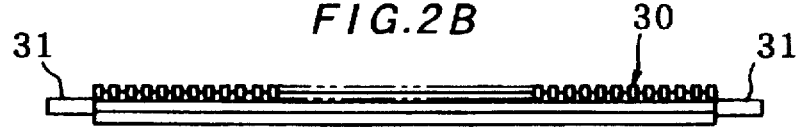
Figure 2C:
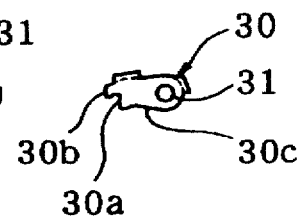
Figure 2D:
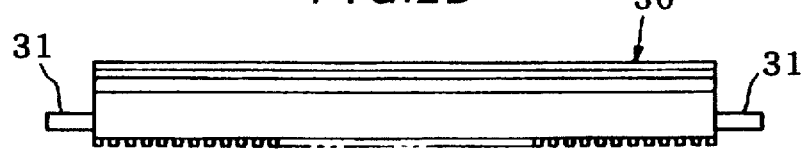

The above and other objects and advantages will be more apparent from the following detailed explanation made with reference to the accompanying drawings.

DESCRIPTION OF THE PREFERRED EMBODIMENTS

Below, an embodiment of the present invention will be explained with reference to the drawings.

FIG. 8 shows an example of an IC chip used as the electronic component. The IC chip 1 is formed by mounting an LSI (not illustrated) on an upper surface of a rectangular shaped multiple layer substrate 2 made of a glass epoxy resin or the like and protecting this by a resin to form a module. A large number of electrodes/terminals 3 are arranged on the lower surface of the substrate 2 along the sides of the substrate 2. The IC socket according to the present invention is used for a case where such an IC chip 1 is detachably mounted on the electronic circuit substrate.

In FIG. 1, FIGS. 2A to 2D, and FIGS. 3A to 3C, the IC socket 10 is provided with a socket body 11 having a substantially rectangular frame shape made of a plastic. Corner engagement pieces 11a which engage with the four corner portions of the IC chip 1 for positioning the IC chip 1 on the socket body 11 are formed at the upper surface of the socket body 11 so as to project therefrom. Note that, for enabling a wiping action in the forward and backward direction mentioned later, each corner engagement piece 11a positions the IC chip 1 to an extent that a slight free movement of the IC chip 1 is allowed. Further, positioning holes 11b for positioning the socket body 11 on the printed circuit board (not illustrated) and temporarily stopping or affixing the same are formed at the four corner portions of the socket body 11, respectively. The positioning holes 11b are used for guiding the jig for moving the sliders mentioned later.

A large number of contact pins 20 are arranged on the upper surface of the frame side portions of the socket body 11 in a direction orthogonal to the plate thickness thereof at a constant interval corresponding to the arrangement of the terminals 3 along the sides of the substrate 2 of the IC chip 1. Each contact pin 20 has a terminal portion piece 21 extended in an inward and outward direction of the frame side portion of the socket body 11 and an arm portion piece 22 constituting the spring means mentioned later. An upward facing contact portion 21a which comes into contact with the terminal 3 of the IC chip 1 in the vicinity of the inner edge of the frame side portion of the socket body 11 and supports the lower surface of the IC chip 1 is formed at one end of the terminal portion piece 21, and a surface-mounting type lead portion 21b extending to the outside of the frame piece portion of the socket body 11 is formed in the other end of the terminal portion piece 21. This lead portion 21b is connected onto the circuit pattern of the printed circuit board (not illustrated) by for example soldering.

Between the contact portion 21a and the lead portion 21b of the terminal portion piece 21 of the contact pin 20, a fitting portion 21c is formed projecting downward in the vicinity of the lead portion 21b. A fitting groove 11c for press-fitting the fitting portion 21c is formed in the upper surface of the socket body 11. Further, ribs 11d and 11e gripping the terminal portion piece 21 of the contact pin 20 on the inside (front side) and outside (rear side) of the fitting groove 11c are provided on the upper surface of the socket body 11 so as to project therefrom. As seen from FIG. 3A, the contact portion 21a of the contact pin 20 forms a free end of the terminal portion piece 21 of the contact pin 20, therefore the contact portion 21a of the contact pin 20 can be bent and resiliently displaced in the plate thickness direction, that is, the direction of arrangement of the contact pins 20 with the fitting portion 21c or the rib 11d on the front side (inside) thereof as the supporting point.

A slider 30 extending along the direction of arrangement of the contact pins 20 is provided on each frame side portion of the IC socket 10 so that it can move along the length direction of the terminal portion pieces 21 of the contact pins 20. As shown in FIG. 3A, a side surface abutting portion 30a which can abut against the side surface of the substrate 2 of the IC chip 1 and a pressing portion 30b which can abut against the upper surface of the substrate 2 are formed at one end of the slider 30. A shaft pin 31 penetrating through the slider 30 in the length direction is integrally provided at the other end portion of the slider 30 by for example insert molding etc. The two ends of this shaft pin 31 project outward from the two end portions of the slider 30 in the length direction. The slider 30 is held between the terminal portion pieces 21 and the arm portion pieces 22 of the contact pins 20, whereby the slider 30 can move along the upper surface of the terminal portion pieces 21 between an opening position at which the pressing portion 30b opens the contact portions 21a of the contact pins 20 upward (refer to FIG. 3A) and a clamping position at which the pressing portion 30b abuts against the upper surface of the substrate 2 of the IC chip 1 and one end surface 30a abuts against the side surface of the substrate 2 (refer to FIG. 3C).

The portions in the vicinity of the contact portions 21a of the terminal portion pieces 21 are bent downward in a projecting shape, whereby recess portions 21d are formed in the upper surface in the vicinity of the contact portions 21a of the terminal portion pieces 21. Then, recess portion 30c is formed in the lower surface of the slider 30 corresponding to the recess portions 21d. Accordingly, when the pressing portion 30b of the slider 30 approaches the upper surface of the substrate 2 of the IC chip 1 from the opening position, one end of the lower surface of the slider 30 moves downward along the recess portions 21d, and therefore also the pressing portion 30b of the slider 30 moves downward while advancing accompanied with this and abuts against the upper surface of the substrate 2 of the IC chip 1 (refer to FIG. 3B). Then, after this, the slider 30 can further advance while making the pressing portion 30b abut against the upper surface of the substrate 2 as it is, and soon the side surface abutting portion 30a of the slider 30 abuts against the side surface of the substrate 2 (refer to FIG. 3C), but when there is a gap between the substrate 2 of the IC chip 1 and a corner portion 11a of the socket body 11, it is possible to further advance the slider 30 by exactly the amount of the gap and push the side surface of the substrate 2 of the IC chip 1 by the side surface abutting portion 30a.

The contact pin 20 is made of a metal having a good spring property. The slider 30 is formed so as to gradually open the arm portion piece 22 upward with respect to the terminal portion piece 21 when the slider 30 moves from the opening position to the clamping position, therefore the spring pressure stored in the arm portion piece 22 rises as the slider 30 approaches the substrate 2 of the IC chip 1 from the opening position. This spring pressure reaches a peak immediately before the pressing portion 30b reaches the upper surface of the substrate 2. When the pressing portion 30 reaches the upper surface of the substrate 2, a spring pressure which is slightly smaller than the peak value but increased larger than that at the opening position is added to the upper surface of the slider 30. Accordingly, the pressing portion 30b of the slider 30 is brought into press-contact with the upper surface of the substrate 2 by the spring pressure thereof and simultaneously the terminal 3 of the lower surface of the substrate 2 is brought into press-contact with the contact portion 21a of the contact pin 20. Then, when the pressing portion 30b reaches the upper surface of the substrate 2, the slider 30 further advances while holding the arm portion piece 2 at substantially a constant opening degree, and therefore the pressing force to be added to the slider 30 is held substantially constant.

As mentioned above, when there is a gap between the substrate 2 of the IC chip 1 and a corner portion 11a of the socket body 11, after the side surface abutting portion 30a abuts against the side surface of the substrate 2 of the IC chip 1, the slider 30 can be further advanced by exactly the amount of the gap and the side surface of the substrate 2 of the IC chip 1 can be pushed by the side surface abutting portion 30a. Accordingly, a wiping action in the movement direction of the slider 30, that is the forward and backward direction, can be produced between the terminal 3 of the IC chip 1 and the contact portion 21a of the contact pin 20. This wiping action in the forward and backward direction can be reciprocated one time in the forward and backward direction by individually moving the two sliders 30 facing each other. Accordingly, a more effective wiping function can be obtained. Further, the sliders 30 on the respective frame side portions of the socket body 11 can be individually moved, therefore the operating force required for the movement of the individual sliders 30 can be reduced. Accordingly, the stress acting upon the IC chip 1 can be reduced and, at the same time, the attachment work of the IC chip 1 can be easily carried out by a small force.

Figure 4:
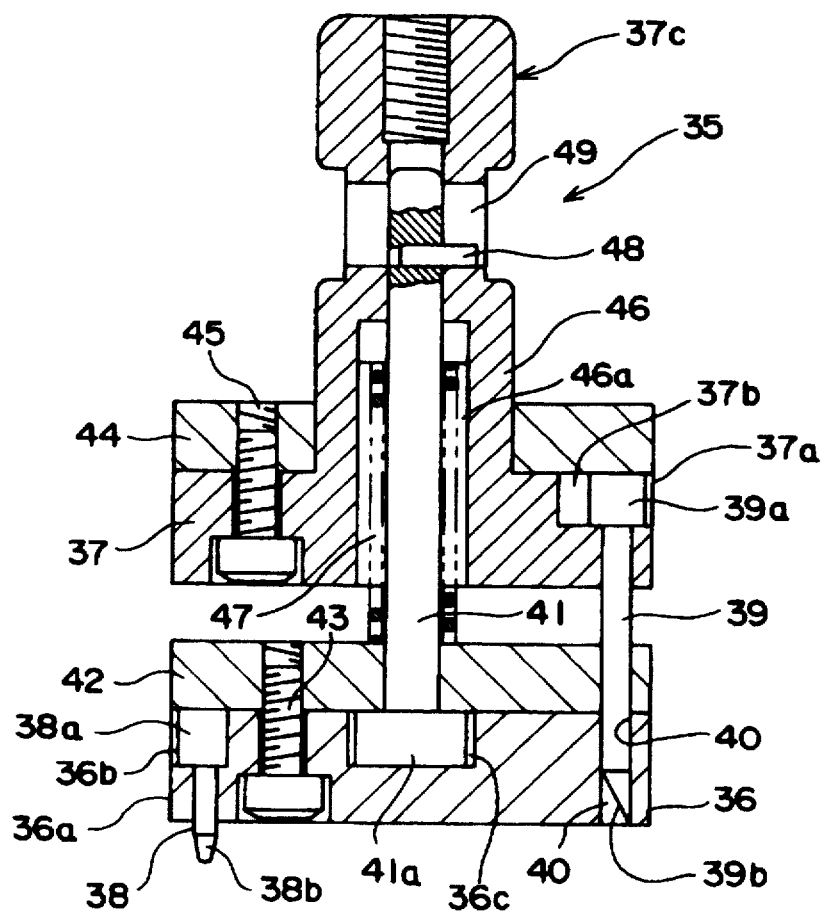
FIG. 4 is a vertically sectional view of an embodiment of the IC socket jig for mounting an IC of the present invention.
Figure 5:
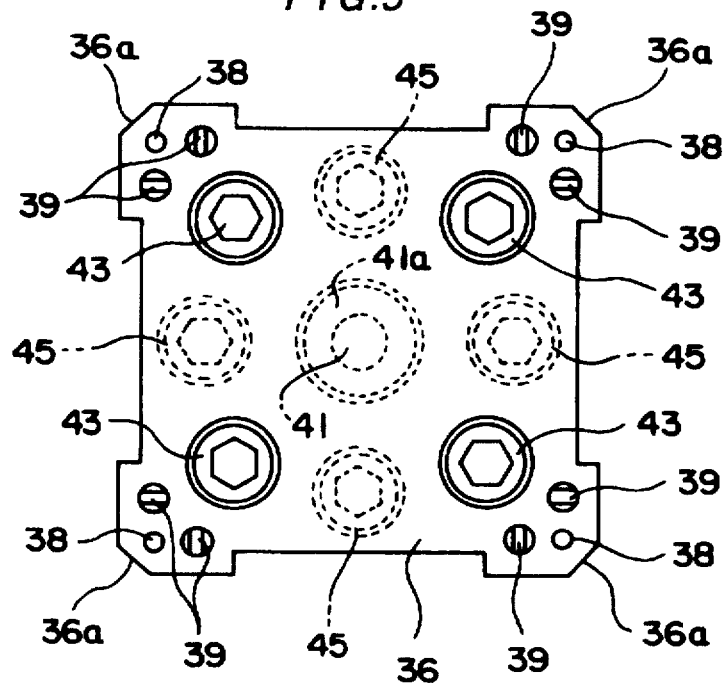
FIG. 5 is a bottom view of the IC socket jig shown in FIG. 4.
Figure 6A:
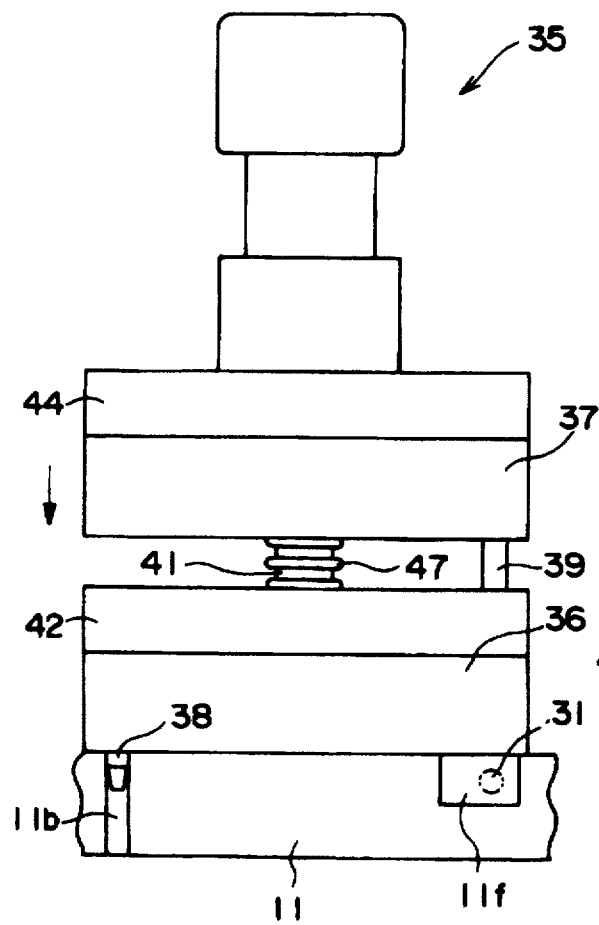
FIGS. 6A and 6B are explanatory views of the operation of the IC socket jig shown in FIG. 4, respectively.
Figure 6B:
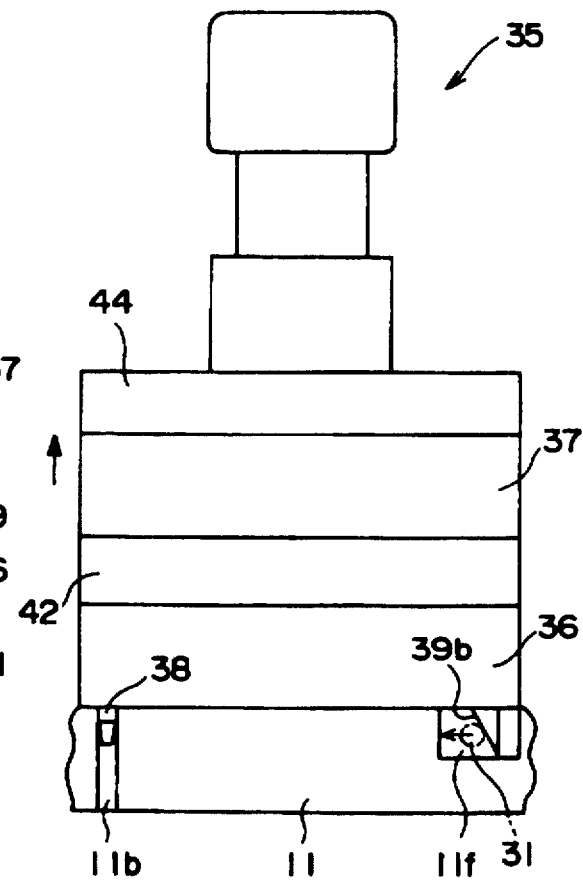

FIG. 4 is a vertical sectional view showing one embodiment of the jig according to the present invention for moving the slider from the opening position to the clamping position; FIG. 5 is a bottom view of the same jig; and FIGS. 6A and 6B are explanatory views of the operation of the same jig. Referring to these figures, a jig 35 has a lower block body 36 in the form of substantially a rectangular stand and an upper block body 37 the upper portion of which exhibits a substantially projecting state acting as the gripper portion 37c, arranged in the upper portion of this lower block body 36. In the lower block body 36, as shown in FIG. 5, positioning pins 38 to be respectively inserted into the positioning holes 11b of the socket body 11 are fixed to the four corner portions 36a, respectively, and further, in the vicinity of each positioning pin 38, two guide holes 40 each in which a cam pin 39 provided on the upper block body 37 so as to project therefrom and coming into contact with the shaft pin 31 of the slider 30 vertically moves are made.

In the positioning pin 38 and the cam pin 39, enlarged diameter portions 38a and 39a are formed in the upper portions, respectively, the enlarged diameter portion 38a of the positioning pin 38 is disposed in a first receiving portion 36b formed in each corner portion 36a of the lower block body 36 and a taper portion 38b of the front end is projected to the outside. A second receiving portion 36c is formed at the center portion of the lower block body 36. It receives the enlarged-diameter portion 41a of the guide shaft 41 so as to be extended to above the lower block body 36. By engaging one part of the enlarged diameter portion 38a and the enlarged diameter 41a with a cover plate 42 covering the upper portion of the lower block body 36 and fixing four portions of the cover plate 42 to the lower block body 36 by a screw 43, the positioning pin 38 and the guide shaft 41 are held by the lower block body 36.

Further, the enlarged diameter portion 39a of the cam pin 39 is disposed in the receiving portion 37b formed in each corner portion 37a of the upper block body 37, and the inclined portion 39b of the tip end is projected so as to be inserted into the guide hole 40. The cam pin 39 is held by the upper block body 37 by engaging one part of the enlarged diameter portion 39a with the cover plate 44 covering the upper portion of the upper block body 37 and fixing four portions of the cover plate 44 to the upper block body 37 by screws 45.

A coil spring 47 is wound around the guide shaft 41 between the upper portion of the cover plate 42 of the lower block body 36 and the inner top portion of the receiving hole 46a formed in the center projecting portion 46 of the upper block body 37. The lower block body 36 and the upper block body 37 are biased in the spatial direction by the outward elastic force of this coil spring 47. Further, a lateral pin 48 is fixed to the upper portion of the guide shaft 41. This lateral pin 48 is inserted into a vertical hole 49 formed in the upper portion of the center convex block 46 of the upper block body 37. The lateral pin 48 regulates the range of movement of the lower block body 36 via the guide shaft 41 by abutting against the upper and lower wall ends of the vertical hole 49. Accordingly, as shown in FIG. 4, in the nonoperation state, the lower block body 36 and the upper block body 37 are in a state separated by a constant gap, and the cam pin 39 is accommodated in the guide hole 40 and in the retracted state.

In order to move the slider 30 from the opening position to the clamping position by the jig 35 having the above configuration, the jig 35 in the state of FIG. 4 is moved downward from above the socket body 11 while holding one part of the gripper portion 37c of the upper portion of the upper block body 37 and the positioning pins 38 projected from the bottom surface of the lower block body 36 are inserted into the positioning holes 11b. By this insertion, the jig 35 is positioned vertically and horizontally with respect to the socket body 11 (refer to FIG. 6A). After the completion of the insertion of the positioning pins 38, the upper block body 37 is moved downward against the elastic force of the coil spring 47 and the cam pin 39 is pushed to the outside from the guide hole 40. Then, the inclined portion 39b of the cam pin 39 abuts against the shaft pin 31 of the slider 30 in the recess portion 11f formed in the socket body 11 (refer to FIG. 6B). Further, when the upper block body 37 is moved downward, the inclined portion 39b presses the shaft pin 31 inwardly of the frame side portion of the socket body 11, and therefore the slider 30 can be moved from the opening position to the clamping position.

After the completion of the clamping, when the downward movement force to the upper block body 37 is removed, the upper block body 37 rises by receiving the biasing force of the coil spring 47. Accordingly, also the cam pin 39 rises together with the upper block body 37 from the abutting position against the shaft pin 31, and returns to the state of FIG. 6A. After the rise of the upper block body 37 and the cam pin 39, when the jig 35 is pulled from the socket body 11 by holding one part of the gripper portion 37c, of the upper portion of the upper block body 37, the positioning pin 38 is only inserted into the positioning hole 11b in the socket body 11, and therefore the jig 35 can be easily detached.

Note that, the jig for moving the slider 30 from the clamping position to the opening position can be easily realized by adopting a configuration as shown in FIGS. 7A and 7B, in which the inclined portion 39a of the tip end of the cam pin 39 is formed opposite to that of the embodiment described before, and a force pressing the shaft pin 31 outwardly of the frame side portion of the socket body 11 is generated.

As apparent from the above explanation, according to the present invention, at the attachment of the IC socket jig, after the positioning with respect to the IC socket is reliably carried out, the cam pin operating the slider can be inserted, whereby the insertion can be smoothly carried out and, at the same time, the pressing of sliders by the inclined portion of the cam pin can be carried out after the horizontal pull-out can be properly carried out, therefore the slider can be reliably operated in the horizontal direction. Further, when the jig is removed from the IC socket, after the engagement between the inclined portion and the slider is released, the positioning pin is pulled out of the positioning hole, and therefore in a state where the counterforce in the horizontal direction with respect to the pressing force to the slider does not act upon the inclined portion of the cam pin, that is, in a state where an unnatural force in the horizontal direction does not act upon the jig via the cam pin, the positioning pin can be easily pulled out from the positioning hole. Accordingly, an IC socket jig having a high reliability which does not give an unnatural force to the IC socket at the attachment and detachment of the jig, and can prevent the deformation and damage of the IC socket and the peeling of the conductor pattern on the circuit substrate due to the contact pin of the IC socket, etc. can be provided.

We claim:

1. An IC socket jig for operating an IC socket having a socket body sized for accommodating therein an electronic component and a slider which is movably attached to said socket body so as to press and affix and release the electronic component with respect to said socket body, said IC socket jig comprising:

a cam member adapted to be moved toward said socket body and away from said socket body in moving directions which are substantially perpendicular to a sliding direction of said slider, said cam member being moveable into wiping contact with said slider, said cam member moving said slider when in wiping contact therewith and while moving toward and away from said socket body; and a positioning pin, connected to said cam member, and adapted to be fitted into a positioning hole formed in said socket body, said positioning pin being movable relative to said cam member in a direction parallel to a moving direction of said cam member within a predetermined distance so that said positioning pin can be fitted into said positioning hole before said cam member is brought into wiping contact with said slider and also can be drawn out of said positioning hole after said cam member is moved away from said slider.

2. The IC socket jig according to claim 1 further comprising an upper block body a lower block body, and a guide shaft connecting said upper block body to said lower block body, said upper block body secured to said cam member so that said cam member moves integrally with said upper block body, while said positioning pin is secured to said lower block body, said lower block body being movable relative to said upper block body in a direction parallel to the moving direction of said upper block body within a predetermined distance.

3. The IC socket jig according to claim 2 further comprising a spring between said upper block body and said lower block body, wherein said positioning pin is urged toward said socket body of said IC socket by said spring.

4. The IC socket jig according to claim 2 wherein said lower block body has a guide hole for guiding said cam member.

* * * * *